(12) United States Patent
Tailliet et al.

(10) Patent No.: US 9,728,248 B2
(45) Date of Patent: Aug. 8, 2017

(54) SEMICONDUCTOR STRUCTURE AND MEMORY DEVICE INCLUDING THE STRUCTURE

(71) Applicant: STMicroelectronics (Rousset) SAS, Rousset (FR)

(72) Inventors: François Tailliet, Fuveau (FR); Marc Battista, Marseille (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 93 days.

(21) Appl. No.: 14/657,914

(22) Filed: Mar. 13, 2015

(65) Prior Publication Data

US 2015/0269989 A1    Sep. 24, 2015

(30) Foreign Application Priority Data

Mar. 21, 2014  (FR) ..................... 14 52362

(51) Int. Cl.
| | | |
|---|---|---|
| *G11C 11/41* | (2006.01) | |
| *G11C 11/412* | (2006.01) | |
| *G11C 14/00* | (2006.01) | |
| *G11C 16/04* | (2006.01) | |
| *H01L 27/11* | (2006.01) | |

(52) U.S. Cl.
CPC .......... *G11C 11/41* (2013.01); *G11C 11/4125* (2013.01); *G11C 14/0054* (2013.01); *G11C 14/0063* (2013.01); *G11C 16/0416* (2013.01); *H01L 27/1104* (2013.01)

(58) Field of Classification Search
CPC ............................ G11C 11/41; G11C 11/4125
USPC ..................................................... 365/185.07
See application file for complete search history.

(56) References Cited

U.S. PATENT DOCUMENTS

| | | | |
|---|---|---|---|
| 4,132,904 | A | 1/1979 | Harari |
| 4,132,905 | A | 1/1979 | Stein |
| 4,337,522 | A | 6/1982 | Stewart |
| (Continued) | | | |

FOREIGN PATENT DOCUMENTS

| | | |
|---|---|---|
| EP | 0250060 | 12/1987 |
| EP | 0357980 A2 | 3/1990 |
| (Continued) | | |

OTHER PUBLICATIONS

Prakash, R. "Nonvolatile SRAM (nvSRAM) Basics," Cypress Perform, Oct. 2013, 9 pages.

*Primary Examiner* — Hoai V Ho
*Assistant Examiner* — Muna A Techane
(74) *Attorney, Agent, or Firm* — Slater Matsil, LLP

(57) ABSTRACT

A semiconductor structure includes first and second source/drain region disposed in a semiconductor body and spaced from each other by a channel region. A gate electrode overlies the channel region and a capacitor electrode is disposed between the gate electrode and the channel region. A first gate dielectric is disposed between the gate electrode and the capacitor electrode and a second gate dielectric disposed between the capacitor electrode and the channel region. A first electrically conductive contact region is in electrical contact with the gate electrode and a second electrically conductive contact region in electrical contact with the capacitor electrode. The first and second contact regions are electrically isolated from one another.

19 Claims, 10 Drawing Sheets

(56) References Cited

U.S. PATENT DOCUMENTS

| | | | |
|---|---|---|---|
| 4,417,325 A * | 11/1983 | Harari | G11C 11/405 |
| | | | 257/263 |
| 4,467,451 A | 8/1984 | Moyer | |
| 4,980,859 A | 12/1990 | Guterman et al. | |
| 5,357,463 A | 10/1994 | Kinney | |
| 5,357,468 A | 10/1994 | Satani et al. | |
| 5,519,663 A | 5/1996 | Harper, Jr. et al. | |
| 6,097,618 A | 8/2000 | Jenne | |
| 6,097,629 A | 8/2000 | Dietrich et al. | |
| 6,362,710 B2 | 3/2002 | Oberndorfer | |
| 6,414,873 B1 | 7/2002 | Herdt | |
| 6,469,930 B1 | 10/2002 | Murray | |
| 7,092,293 B1 * | 8/2006 | Young | G11C 14/00 |
| | | | 365/185.05 |
| 7,164,608 B2 | 1/2007 | Lee | |
| 8,018,768 B2 | 9/2011 | Shih et al. | |
| 8,331,150 B2 | 12/2012 | Hsu et al. | |
| 2006/0023503 A1 | 2/2006 | Lee | |
| 2009/0190402 A1 | 7/2009 | Hsu et al. | |
| 2009/0213664 A1 | 8/2009 | Kikuchi et al. | |
| 2011/0044109 A1 * | 2/2011 | Shih | G11C 14/0063 |
| | | | 365/185.08 |
| 2014/0369119 A1 | 12/2014 | Tailliet et al. | |
| 2014/0369120 A1 | 12/2014 | Tailliet et al. | |
| 2015/0016188 A1 | 1/2015 | Tailliet et al. | |

FOREIGN PATENT DOCUMENTS

| | | |
|---|---|---|
| EP | 1575057 | 9/2005 |
| EP | 1575075 | 9/2005 |
| FR | 2499769 A1 | 8/1982 |
| FR | 3007185 | 12/2014 |
| FR | 3007186 | 12/2014 |
| FR | 3008534 A1 | 1/2015 |
| WO | 9527982 A1 | 10/1995 |

\* cited by examiner

SEMICONDUCTOR STRUCTURE AND MEMORY DEVICE INCLUDING THE STRUCTURE

This application claims the benefit of French Application No. 1452362, filed on Mar. 21, 2014, which application is hereby incorporated herein by reference.

TECHNICAL FIELD

The invention more particularly relates to a way of hardening such a memory cell against accidental flipping in the SRAM memory.

BACKGROUND

An elementary memory cell of SRAM type is a volatile memory cell, that is to say one that loses its data in the event of a power cut, but that offers a very rapid access speed and infinite cycling.

A nonvolatile elementary memory cell, for example, a memory cell of EEPROM type, allows the data item to be preserved in the event of a power cut but cannot be cycled indefinitely.

A memory cell associating an SRAM elementary cell and one or more (for example two or four) nonvolatile cells makes it possible to combine the advantages of the two approaches, namely the speed and the infinite endurance of the SRAM memory and the nonvolatility of the nonvolatile memory—flash or EEPROM memory for example.

Under normal operating conditions, a data item is written and read to/from a memory cell of this kind in the elementary cell of SRAM type. On the other hand, notably when there is a power cut, the content of the SRAM elementary cell is transferred to the nonvolatile elementary memory cell(s) associated therewith.

Then, notably when power returns, the data contained in the nonvolatile memory cells are reloaded into the corresponding SRAM elementary memory cell.

Examples of architectures of such memory cells associating SRAM memory and nonvolatile memory are described in the documents U.S. Pat. No. 4,132,905, U.S. Pat. No. 4,467,451, U.S. Pat. No. 4,980,859, U.S. Pat. No. 7,164,608 and U.S. Pat. No. 8,018,768 and in the French patent applications filed under the numbers 1355439 (corresponding to US 2014/0369120), 1355440 (corresponding to US 2014/0369119) and 1356720 (corresponding to US 2015/0016188).

There is a risk of accidental bit flipping in the SRAM elementary cell, i.e., of the logic value of the datum stored in the SRAM memory in the flip-flop formed by the two inverters of this memory being inverted. In other words, if, at a given instant, a low logic level is present at the output of one of the inverters and a high logic level is present at the output of the other inverter, bit flipping results in the high logic level being replaced by the low logic level and vice versa, thereby leading to the stored datum being inverted.

These bit-flipping errors, also referred to by those skilled in the art as "soft errors", may be caused by interference created by particles such as alpha particles or even cosmic rays, or even by the memory device being attacked by a laser beam.

One solution currently used to suppress these bit-flipping errors consists in using error-correcting codes and in physically separating bits belonging to a given error correction group.

SUMMARY

Embodiments of the invention relate to memory devices and more particularly those associating, within one and the same memory cell, a static random access memory (SRAM) elementary cell and one or more, for example two or four, nonvolatile elementary memory cells, in particular double-gate electrically erasable programmable read-only memory (EEPROM) elementary memory cells.

According to one embodiment, a completely different and simpler solution is provided for limiting the risk of accidental bit flipping in the SRAM cell.

According to one embodiment, it is thus proposed to use, in the SRAM cell, at least one integrated structure comprising an MOS transistor having a first gate dielectric and a capacitor having a first electrode formed by the gate region of the transistor and a second electrode located above said first electrode and separated from the first electrode by a second gate dielectric located above said first gate dielectric, a first electrically conductive contact region making contact with the gate region and a second electrically conductive contact region making contact with the second electrode, the two contact regions not being electrically connected.

Such a structure has a compact footprint since the first electrode of the capacitor is formed by the gate region of the transistor, thereby allowing, simply, a filtering capacitor to be formed within the SRAM cell, the capacitance of this capacitor not only being generally much higher than the capacitances of capacitors produced in the first metallization level of the integrated circuit, but also better controlled, this capacitor furthermore not coupling to interconnects located on top of the SRAM cell.

This filtering capacitor greatly increases the energy required to accidentally flip the flip-flop formed by the two inverters of the SRAM cell.

Thus, according to one aspect, a memory device is provided comprising at least one memory cell of the type comprising an SRAM elementary memory cell possessing two cross-coupled inverters and at least one nonvolatile elementary memory cell, said cells being coupled together.

According to one general feature of this aspect, said at least one nonvolatile elementary memory cell comprises at least one floating-gate transistor and the SRAM elementary memory cell comprises at least two integrated structures such as defined above the MOS transistors of which respectively form at least two transistors, for example the pMOS transistors, of the two inverters; each second electrode is intended to be connected to a potential, for example the output node potential of the inverter or even to a supply voltage or indeed to ground; the other transistors of the SRAM elementary memory cell comprise a gate region surmounted by an auxiliary region located in the same level as the second electrodes of the integrated structures and separated from the gate region by the gate dielectric.

Thus, when the one or more transistors of the nonvolatile elementary memory cell are one or more floating-gate transistors, and thus transistors comprising two polysilicon levels per example, all the transistors of the SRAM cell are advantageously produced in these two polysilicon levels and advantageously these two existing polysilicon levels are used to produce, on at least two of the transistors, for example the pMOS transistors, of the two inverters, said aforementioned integrated structures, the capacitor of which is formed between the two polysilicon levels. Furthermore, regarding the other transistors of the SRAM cell, for which transistors a capacitor is not required, either only the lower polysilicon level will be electrically connected or the two polysilicon levels will be short-circuited.

The gate dielectric that separates the two electrodes of the capacitor advantageously comprises a silicon nitride layer sandwiched between two silicon dioxide layers. Such a composition makes it possible to obtain a capacitor having a well-controlled capacitance, typically about 3 fF/μm².

Moreover, these additional capacitors increase the capacitance between the supply and ground of the SRAM memory plane and therefore form a decoupling capacitor improving noise immunity.

Each nonvolatile elementary memory cell may be an electrically erasable programmable read-only memory (EEPROM) cell.

Moreover, the memory device may comprise a memory plane containing rows and columns of memory cells.

According to another aspect, an integrated circuit is provided incorporating a memory device such as defined above.

BRIEF DESCRIPTION OF THE DRAWINGS

Other advantages and features of the invention will become apparent on examining the following detailed description of completely nonlimiting embodiments, and the appended drawings in which.

DETAILED DESCRIPTION OF ILLUSTRATIVE EMBODIMENTS

Figure 1:
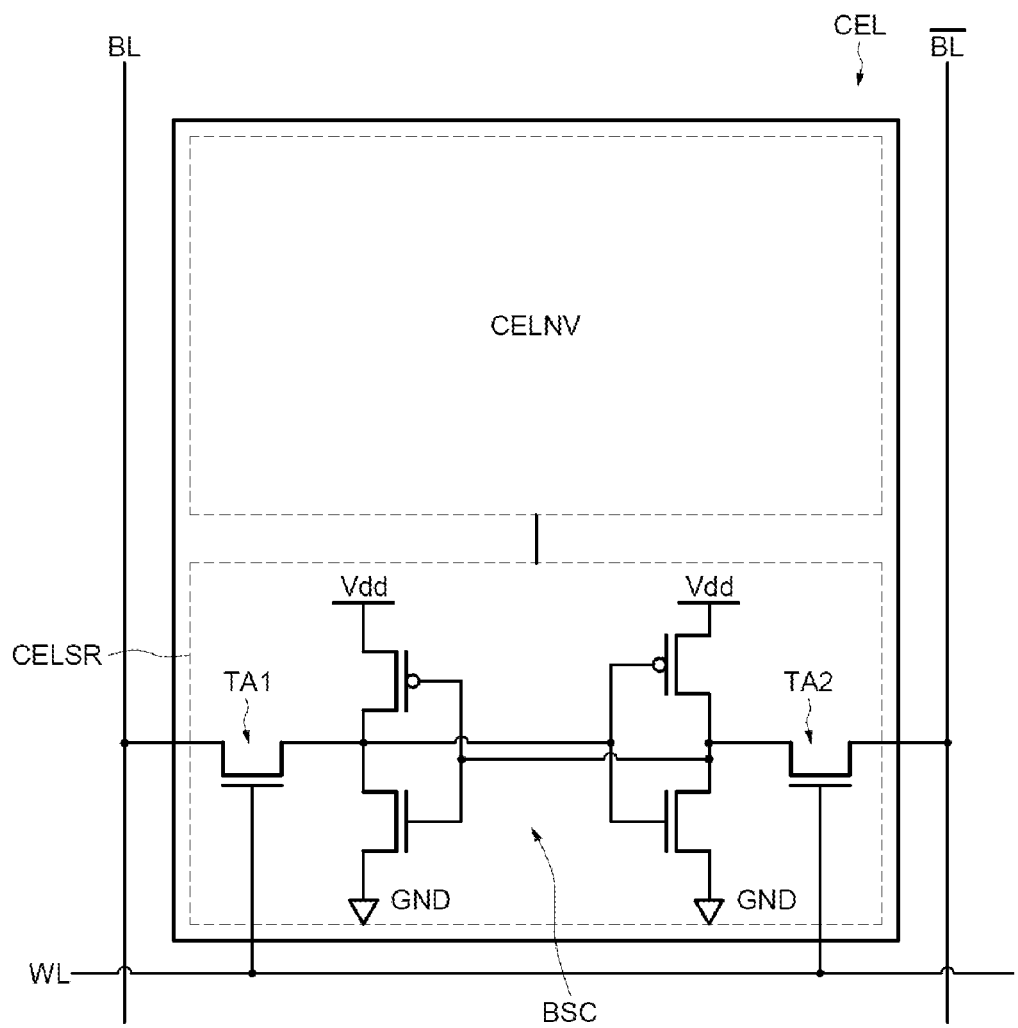
FIG. 1 schematically illustrates a prior-art memory cell.

In FIG. 1, the reference CEL designates a memory cell of a memory plane, comprising an SRAM elementary memory cell CELSR and at least one nonvolatile elementary memory cell CELNV, these two elementary memory cells being coupled together.

The elementary memory cell CELSR has a conventional structure that comprises a flip-flop BSC formed from two cross-connected CMOS inverters, and two access transistors TA1 and TA2.

The two inverters are connected between a power supply terminal, which is intended to be connected to the supply voltage Vdd, and ground GND.

The two access transistors TA1 and TA2 are respectively connected between the outputs of the two inverters and two bit lines BL and $\overline{BL}$, $\overline{BL}$ designating the complementary bit line of the line BL.

The gates of the access transistors TA1 and TA2 are connected to a word line WL.

The operations for reading and writing a datum to the elementary memory cell CELSR are conventional operations known per se.

When the power is cut or on an external signal, the data contained in the elementary memory cell CELSR is transferred and stored in the nonvolatile elementary memory cell CELNV. This is what is referred to as a "nonvolatile transfer." Next, when power returns, the elementary memory cell CELSR is reloaded with the content of the nonvolatile elementary memory cell CELNV.

Furthermore, depending on the configurations chosen during this operation for reloading the cell CELSR, the datum may or may not be inverted relative to that initially stored in the memory cell CELSR before the nonvolatile transfer to the nonvolatile elementary memory cell CELNV.

As indicated above, such an SRAM elementary memory cell CELSR may run a risk of accidental flipping of logic states present at the output nodes of the two inverters, for example when hit by cosmic rays or even during a laser-beam attack.

Figure 2:
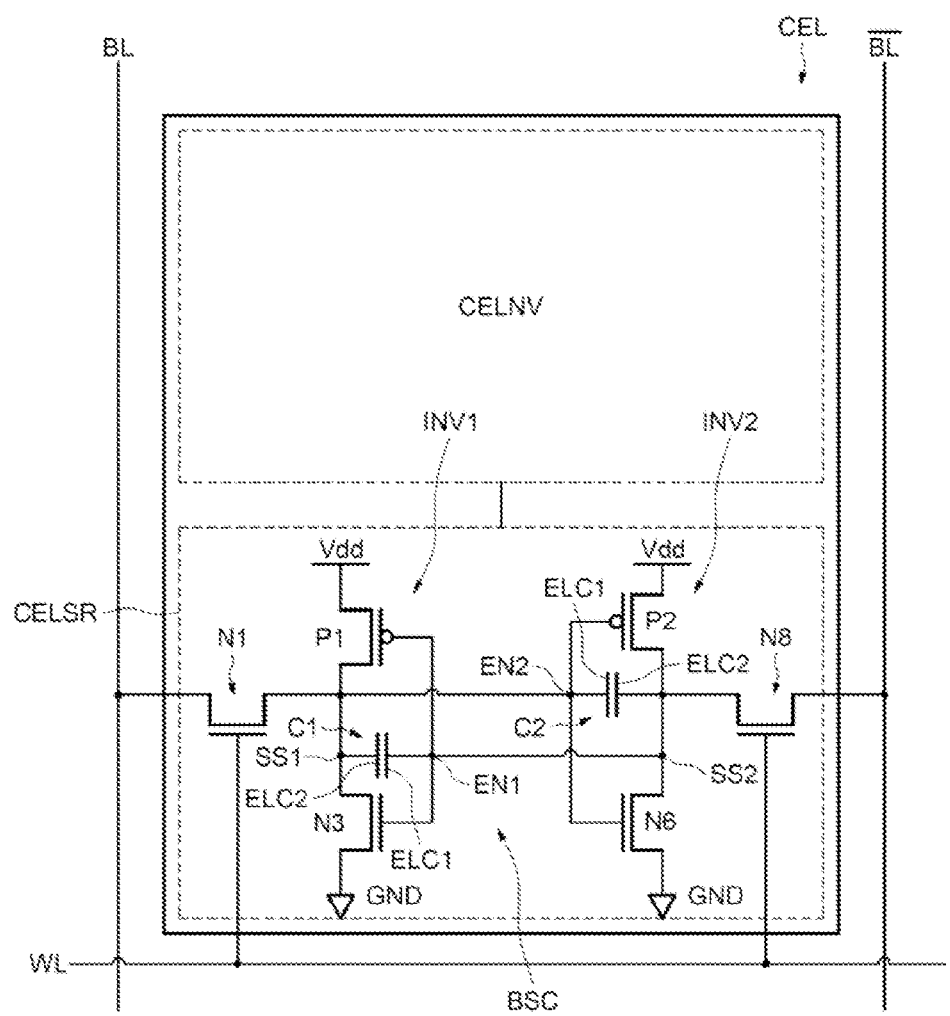
FIGS. 2 to 15 schematically illustrate various embodiments of the invention.

The elementary memory cell CELSR of the cell in FIG. 2 is configured to decrease this risk of accidental flipping.

In this respect, the cell CELSR comprises a first capacitor C1 a first electrode ELC1 of which is connected to the input EN1 and a second electrode ELC2 of which is connected to the output SS1 of the first inverter INV1 of the flip-flop BSC, this first inverter INV1 comprising the pMOS transistor P1 and the nMOS transistor N3.

Likewise, a second capacitor C2 is connected between the input EN2 and the output SS2 of the second inverter INV2 of the flip-flop BSC, comprising the pMOS transistor P2 and the nMOS transistor N6.

In this embodiment, the two access transistors of the cell CELSR are referenced N1 and N8.

These two capacitors C1 and C2 allow the total capacitance of the flip-flop BSC to be increased, thereby increasing the energy required to accidentally flip the flip-flop BSC.

Figure 3:
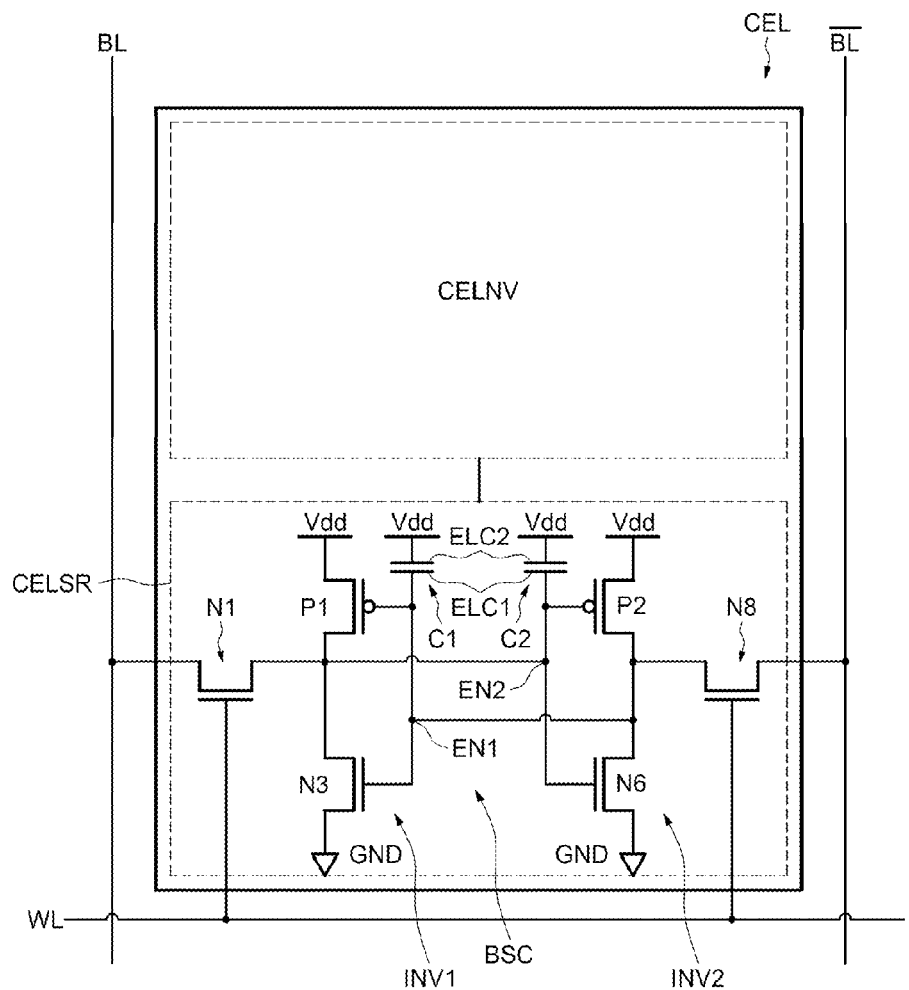
Figure 4:
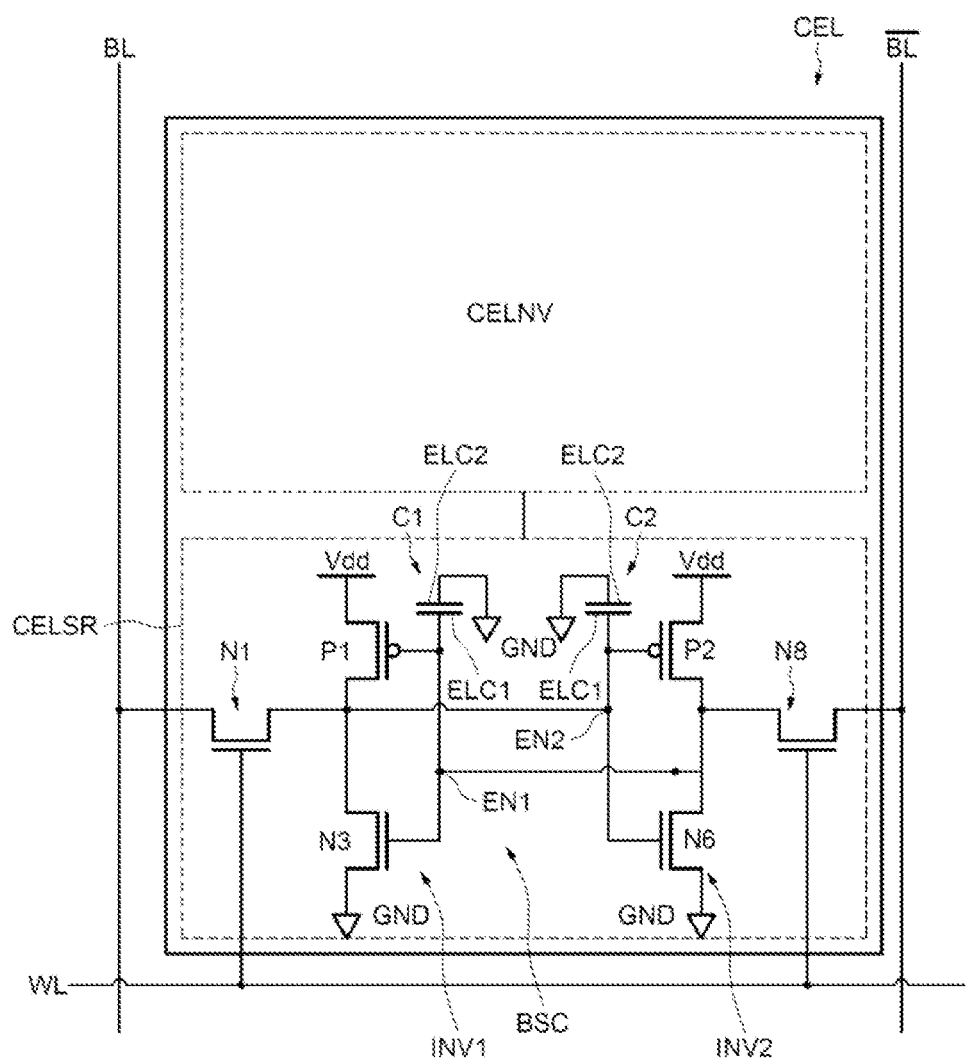

Although in the embodiment in FIG. 2, each capacitor is connected between the input and output of the corresponding inverter, it is possible, as illustrated in FIG. 3, to connect the second electrode of each capacitor C1, C2 to a fixed potential, for example the supply voltage Vdd, or indeed, as illustrated in FIG. 4, ground GND.

Connecting each capacitor between the input and output of the corresponding inverter (FIG. 2) makes it possible to more greatly increase, relative to connections to the supply voltage (FIG. 3) or ground (FIG. 4), the amount of energy that has to be injected to flip the flip-flop because, as the flip-flop is being flipped, the potential of one of the electrodes of the capacitor increases whereas the potential of the other electrode decreases, thereby doubling the voltage excursion required to complete the flip. In contrast, since the flip-flop then takes longer to flip, it takes longer to reload the cell CELSR (i.e. to transfer the datum from the nonvolatile cell to the SRAM cell). However, this is not a constraint in such cells as write times of a few tens of nanoseconds are acceptable.

Connecting each capacitor to a fixed potential (the supply voltage Vdd or ground as illustrated in FIGS. 3 and 4) makes it possible to prevent the input node having any influence on the output node of an inverter, thereby making a better nonvolatile reload of the cell CELSR possible.

A simple way of producing the capacitors C1 and C2 will now be described with reference more particularly to FIGS. 5 to 10.

Figure 5:
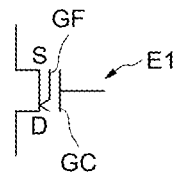
Figure 6:
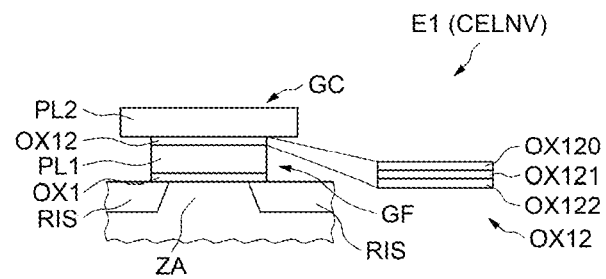

As illustrated in FIGS. 5 and 6, the one or more nonvolatile memory cells CELNV comprise one or more floating-gate transistors E1. More precisely, the transistor E1 comprises, as illustrated in FIG. 5, a floating gate GF surmounted by a control gate GC.

As illustrated in FIG. 6, the floating gate comprises a first gate region PL1, here made of polysilicon, separated from the underlying channel region, which is located in an active zone ZA of the substrate, by a gate oxide OX1, for example silicon dioxide, typically having a thickness comprised between 20 Å and 250 Å. The active zone ZA is bounded in the conventional way by an isolating region RIS, for example a shallow trench isolation (STI) region.

The control gate GC also comprises a gate region PL2, here also made of polysilicon, separated from the gate region PL1 by a gate dielectric OX12. This gate dielectric OX12 advantageously comprises a silicon nitride ($Si_3N_4$) layer OX121 sandwiched between two silicon dioxide (SiO$_2$) layers OX120, OX122. The thickness of the gate dielectric OX12 is typically comprised between 100 Å and 200 Å.

All the transistors of the memory cell CEL, and in particular all the transistors of the SRAM elementary memory cell CELSR, are also produced in a double gate level technology, the geometry of the gate regions are however different from that of the gate regions of the floating-gate transistors.

Furthermore, this double-level gate region will advantageously be used to form the capacitors C1 and C2.

Figure 7:
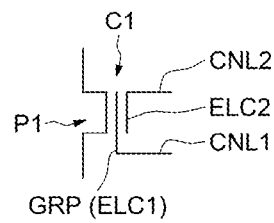
Figure 8:
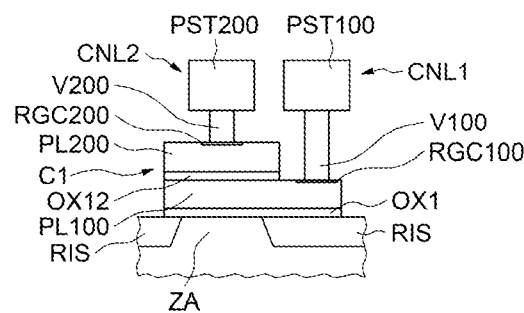

This is schematically illustrated in FIGS. 7 and 8, as regards, in this embodiment, the pMOS transistors P1 and P2 of the two inverters of the flip-flop BSC of the elementary memory cell CELSR. For the sake of simplicity of the figures, only the pMOS transistor P1 has been shown in FIGS. 7 and 8.

The gate region PL100, here made of polysilicon, separated from the underlying portion of the active zone ZA (bounded by an isolating region RIS) by the gate oxide OX1, defines the gate GRP of the transistor P1 but also a first electrode ELC1 of the capacitor C1.

The second region PL200, here also made of polysilicon, separated from the first region PL100 by the gate dielectric OX12 defines a second electrode ELC2 of the capacitor C1.

A first electrical connection CNL1 makes contact with an electrically conductive contact region RGC100 (for example, a metal silicide) of the gate GRP and comprises, in this embodiment, a contact V100 and a metal track portion PST100 that is located in the first metallization level of the integrated circuit.

A second electrical connection CNL2 makes contact with an electrically conductive contact region RGC200 (for example a metal silicide) of the second electrode PL200 (ELC2) and here also comprises a contact V200 and a metal track portion PST200 that is also located in the first metallization level of the integrated circuit.

This electrical connection CNL2 allows the second electrode PL200 to be connected to a potential that may, as indicated above, be the potential of an output node of the corresponding inverter or even a fixed potential such as the supply voltage or even ground.

The two electrical connections CNL1 and CNL2 are not connected together.

Thus here, a compact structure comprising a MOS transistor the gate of which is connected to a capacitor has been produced in a very simple way.

In the embodiment just described, only the pMOS transistors of the two inverters are equipped with a capacitor connected to their gate. Specifically, in this embodiment, given that the drain/source distance of an nMOS transistor is smaller than the drain/source distance of a pMOS transistor, it proves to be more difficult to also equip the nMOS transistors of the two inverters with a capacitor in an analogous way to that described with reference to FIGS. 7 and 8 while meeting DRM (design rules manual) design rules.

Of course, it would be possible in other embodiments for only the nMOS transistors of the two inverters to be equipped with a capacitor connected to their gate or even for all the pMOS and nMOS transistors of the two inverters to be equipped with a capacitor connected to their gate.

Figure 9:
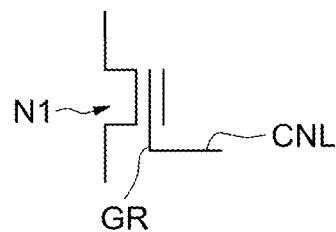
Figure 10:
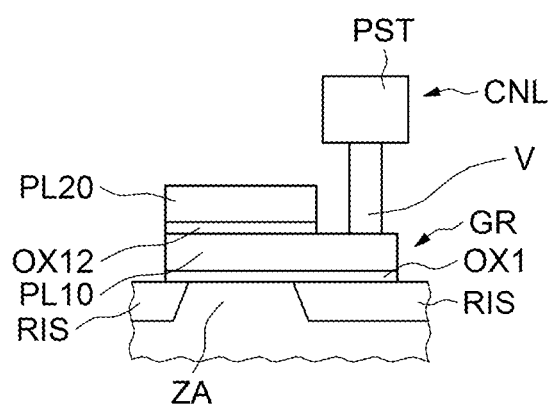

As regards the other transistors of the SRAM cell, especially the access transistors N1, N8 but also the nMOS transistors N3 and N6, it may be seen in FIGS. 9 and 10 that the second polysilicon region PL20, separated from the first polysilicon region PL10 by the gate dielectric OX12, is left floating. The first polysilicon region PL10, separated from the underlying active zone ZA (bounded by an isolating region RIS) by the gate oxide OX1, forms the gate GR of the corresponding transistor, here the transistor N1. An electrical connection CNL, comprising a contact V and a metal track portion PST located in the metallization level M1 allows a control voltage to be applied to the gate GR.

As a variant, instead of leaving the second gate region PL20 floating, it would be possible to short-circuit it with the first gate region PL10.

The invention is applicable to any type of nonvolatile memory cell comprising one or more floating-gate transistors, such as EEPROM cells for example.

Figure 11:
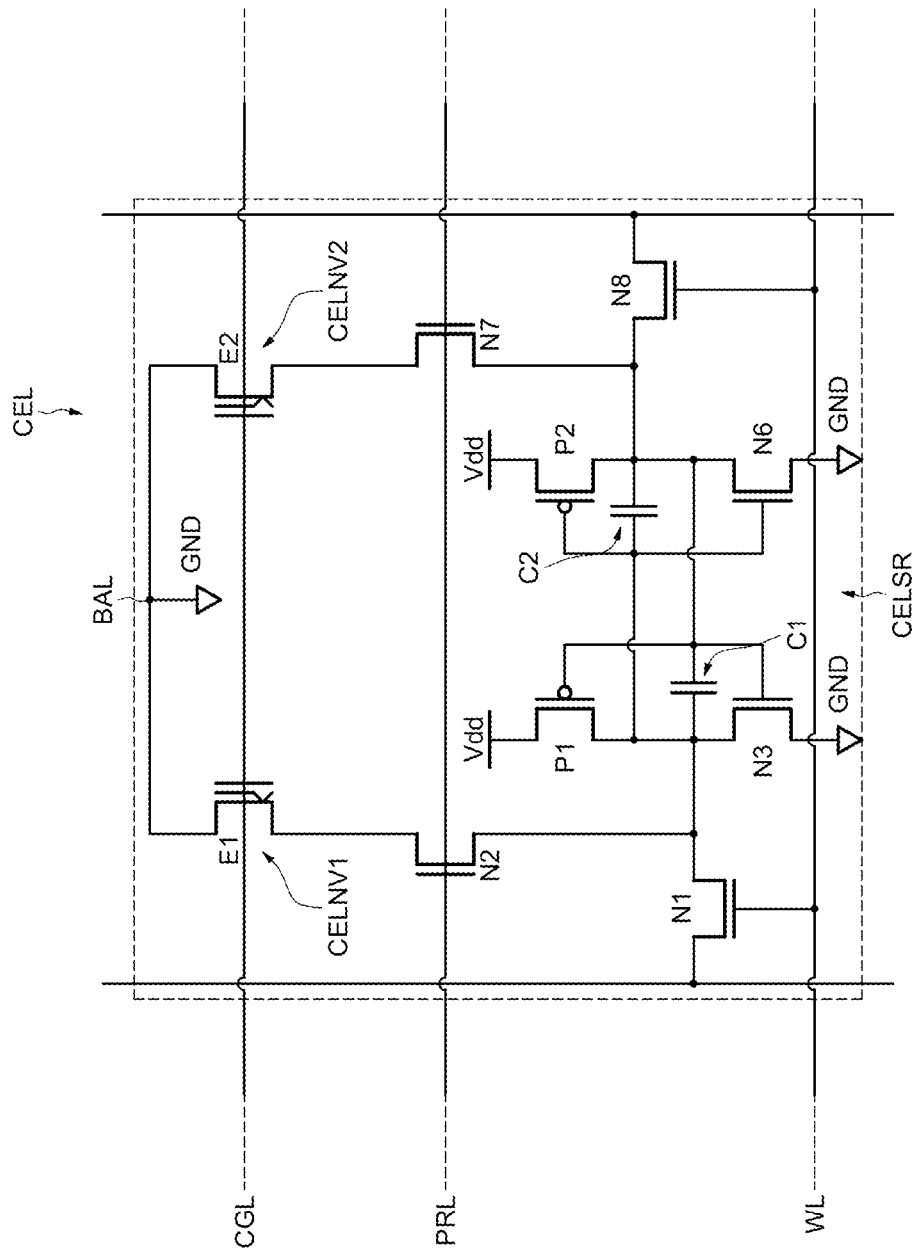

FIG. 11 illustrates one embodiment of a memory cell CEL comprising the SRAM elementary memory cell CELSR and two nonvolatile EEPROM elementary cells CELNV1 and CELNV2 here comprising two floating-gate transistors E1 and E2.

Such a cell has been described in the French patent application numbered 1356720. Certain of its features will now be recalled.

The nonvolatile EEPROM cells of the cell CEL are conventional cells, that is to say in which the selection transistor has been removed and having a tunnel injection zone between their floating gate and drain.

The sources of these two transistors E1 and E2 are connected to a power supply terminal BAL, which in this case is grounded.

As for the control electrodes of the two floating-gate transistors E1 and E2, they are connected to a first control line CGL.

The drains of the two floating-gate transistors E1 and E2 are connected to the inputs and outputs of the two inverters of the cell CELSR by an interconnect stage that here comprises two nMOS interconnect transistors, referenced N2 and N7.

More precisely, the two interconnect transistors N2 and N7 are connected between the drains of the two floating-gate transistors E1 and E2 and the two outputs of the two inverters P1, N3 and P2, N6 respectively. Moreover, the control electrodes (gates) of these two interconnect transistors N2 and N7 are connected to a second control line PRL.

During an operation of writing to the elementary memory cell CELSR, this being a conventional write operation, the control line PRL is grounded, turning off the interconnect stage. Equally, the first control line CGL is likewise grounded.

As is well known by those skilled in the art, a nonvolatile transfer or write operation is made up of an erase cycle followed by a differential programming cycle as two nonvolatile elementary memory cells are present.

For the erase cycle, the line PRL remains grounded, turning off the interconnect transistors N2 and N7. Next, an erase voltage is delivered via the first control line CGL.

During the differential programming cycle, the second control line PRL passes to the supply voltage, turning on the transistors N2 and N7. A programming voltage is then delivered via the first control line CGL.

To reload the cell CELSR, the first control line CGL passes to a reference read voltage, typically 1 volt, while the second control line PRL is at a voltage of 2 volts, for example so as to turn on the interconnect transistors N2 and N7.

Figure 12:
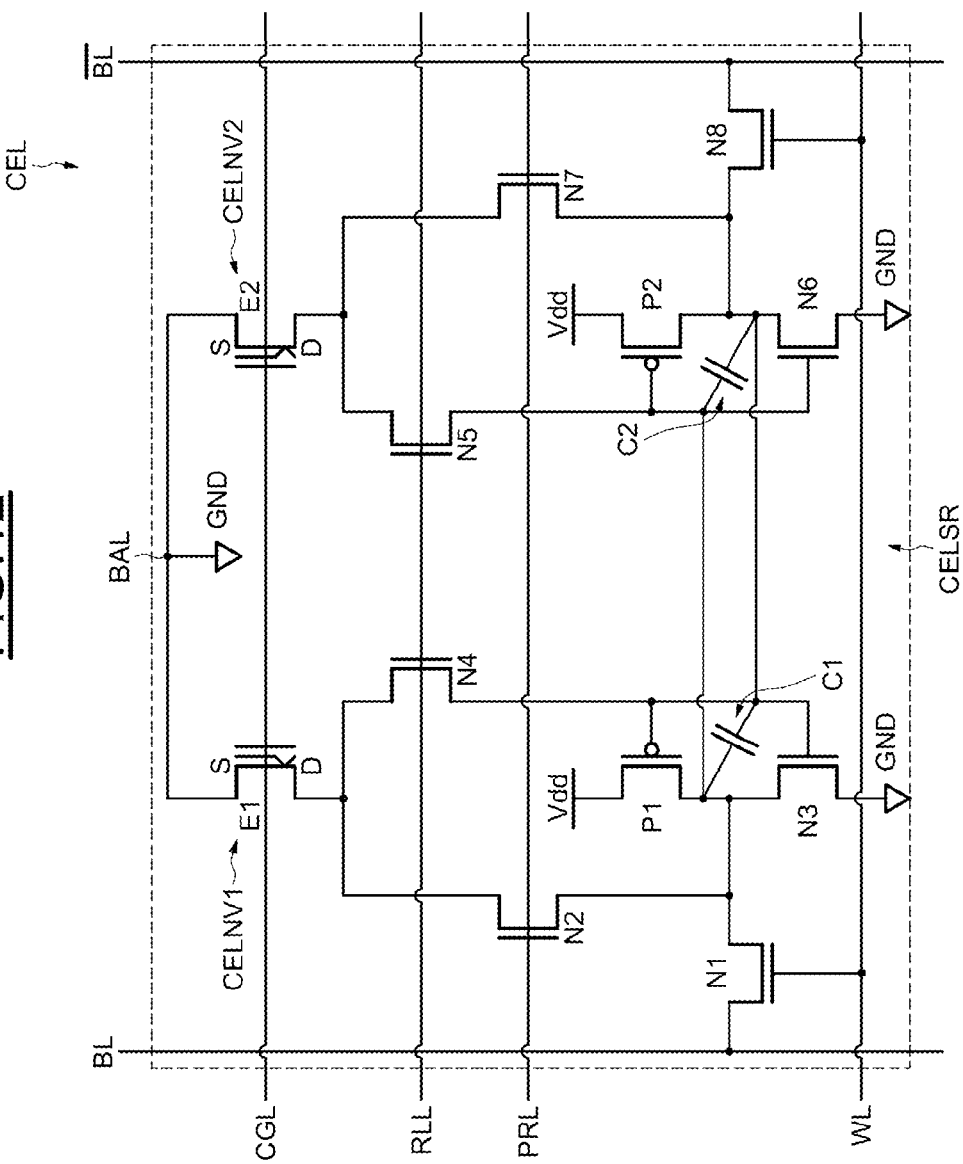

FIG. 12 illustrates another embodiment of a memory cell CEL, here again incorporating two nonvolatile EEPROM memory cells CELNV1 and CELNV2 here comprising two floating-gate transistors E1 and E2.

Such a cell has been described in the patent application numbered 1355439. Certain of its features will now be recalled.

Here again, the nonvolatile EEPROM cells of the cell CEL are conventional cells, that is to say in which the selection transistor has been removed and having a tunnel injection zone between their floating gate and drain.

The sources of these two transistors E1 and E2 are connected to a power supply terminal BAL, which in this case is grounded.

As for the control electrodes of the two floating-gate transistors E1 and E2, they are connected to a first control line CGL.

The drains of the two floating-gate transistors E1 and E2 are connected to the inputs and outputs of the two inverters by an interconnect stage that here comprises two first nMOS interconnect transistors, referenced N2 and N7, and two second nMOS interconnect transistors, referenced N4 and N5.

More precisely, the two first interconnect transistors N2 and N7 are respectively connected between the drains of the two floating-gate transistors E1 and E2 and the two outputs of the two inverters P1, N3 and P2, N6. Moreover, the control electrodes (gates) of these two interconnect transistors N2 and N7 are connected to a second control line PRL.

The two second interconnect transistors N4 and N5 are themselves respectively connected between the drains of the two floating-gate transistors E1 and E2 and the two inputs of the two inverters P1, N3 and P2, N6.

The control electrodes of these two second interconnect transistors N4 and N5 are connected to a third control line RLL.

Although the two second interconnect transistors N4 and N5 are not essential, they are particularly advantageous as they make it possible to prevent data from being inverted when the contents of the two nonvolatile cells E1 and E2 are reloaded into the SRAM elementary memory cell CELSR, even when the power supply terminal BAL is grounded.

The operation used to write to the elementary memory cell CELSR is a conventional write operation.

Thus, the control lines PRL, RLL are grounded, turning off the interconnect stage. Equally, the first control line CGL is likewise grounded.

The operation used to read from the cell CELSR is also a conventional read operation.

For the erase cycle, the lines PRL and PLL remain grounded, turning off the interconnect transistors N2, N4, N5 and N7. Next, an erase voltage is sent on the first control line CGL.

For the differential programming cycle, the second control line PRL passes to the supply voltage Vdd while the third control line RLL remains grounded.

Therefore, the interconnect transistors N2 and N7 are turned on while the interconnect transistors N4 and N5 are turned off.

A programming voltage is then sent on the first control line CGL.

The floating-gate transistors E1 and E2 are all turned off during this differential programming operation.

To reload the cell CELSR, the first control line CGL passes to a reference read voltage, typically 1 volt, while the second control line PRL is grounded and the third control line RLL is at a voltage of 2 volts, for example, so as to turn on the transistors N4 and N5 while the transistors N2 and N7 are turned off.

The voltage of the word line WL is zero.

Figure 13:
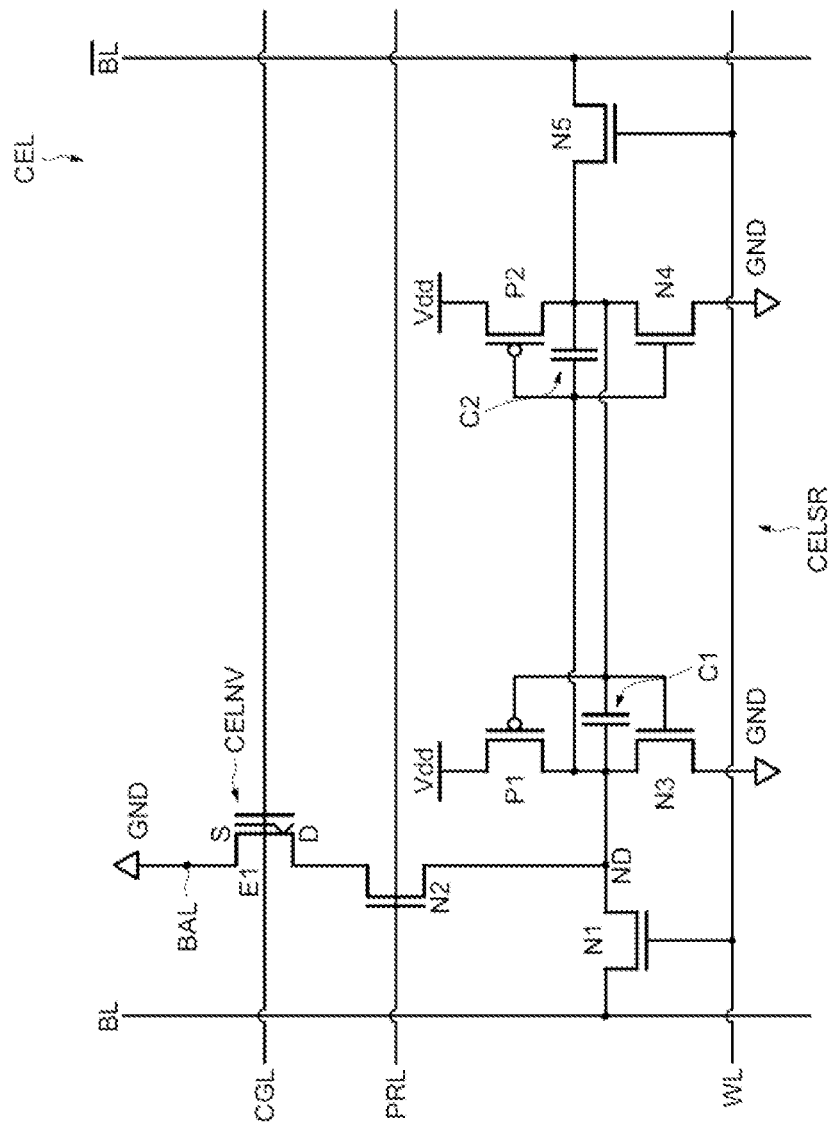

FIG. 13 illustrates yet another embodiment of a memory cell CEL.

Such a cell has been described in the aforementioned French patent application numbered 1355440.

Certain of its features will now be recalled.

This memory cell CEL comprises a single nonvolatile EEPROM elementary cell CELNV here comprising a controllable floating-gate transistor E1 that is turned off during an operation for programming a datum stored in the SRAM elementary memory cell into the nonvolatile elementary memory cell.

Here again, the nonvolatile EEPROM cell of the cell CEL is a conventional cell, that is to say in which the selection transistor has been removed and having a tunnel injection zone between its floating gate and drain.

The source of the transistor E1 is connected to a power supply terminal BAL that is grounded.

The control electrode of the floating-gate transistor E1 is itself connected to a first control line CGL.

The drain of the floating-gate transistor E1 is in this case connected to the output (node ND) of the first inverter P1, N3 of the elementary memory cell CELSR by means of an interconnect stage that here comprises a first interconnect transistor N2. This single interconnect transistor N2 is in this case an nMOS transistor.

The control electrode (gate) of this first interconnect transistor N2 is connected to a second control line PRL. Therefore, the interconnect stage is controlled by a signal external to the memory cell CEL, namely by the control voltage present on the second control line PRL.

The operation used to write to the elementary memory cell CELSR is here again a conventional write operation.

Thus, the control line PRL is grounded, turning off the interconnect stage. Equally, the first control line CGL is likewise grounded.

For the erase cycle, the line PRL remains grounded, turning off the interconnect transistor N2. Next, an erase voltage is sent on the first control line CGL.

For the differential programming cycle, the second control line PRL passes to the supply voltage Vdd.

Therefore, the interconnect transistor N2 is turned on.

A programming voltage is then sent on the first control line CGL.

Before it is reloaded, the SRAM elementary memory cell CELSR is initialised (or reset) so as to initialize it to a known state and to prevent it from entering into a metastable state.

This initialization may for example be obtained by writing a "1" to the SRAM using the conventional write procedure.

For the reloading, the first control line CGL passes to a reference read voltage, typically 1 volt, while the second control line PRL is at a voltage of 2 volts, for example, so as to turn on the interconnect transistor N2.

The voltage of the word line WL is zero.

Figure 14:
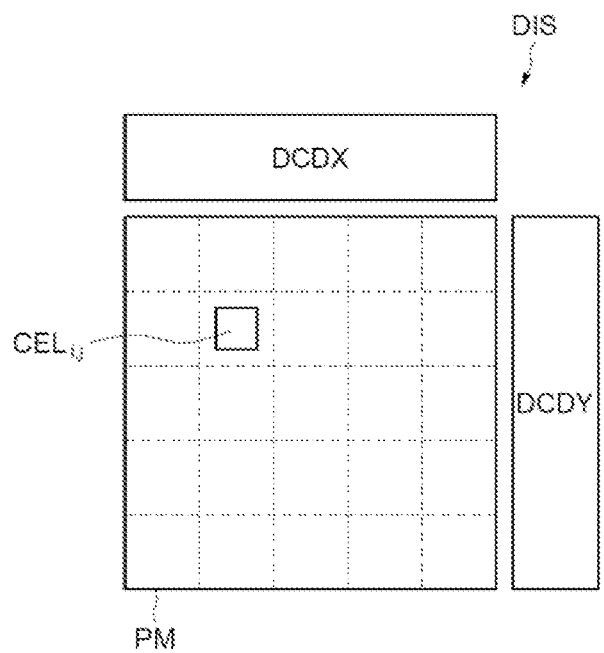

Of course, as schematically illustrated in FIG. 14, the memory device DIS may in practice comprise a memory plane PM comprising a matrix of cells CELij organized into rows and columns, said plane being associated, in the conventional way, with a column decoder DCDX and a row decoder DCDY.

Figure 15:
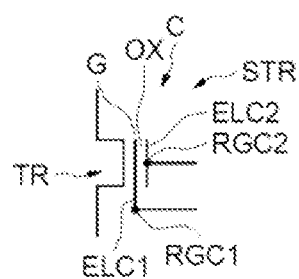

As was seen above, the memory device uses at least two integrated structures of the type of those illustrated in FIG. 15, i.e. comprising a MOS transistor TR and a capacitor C having a first electrode ELC1 formed by the gate region G of the transistor TR and a second electrode ELC2 separated from the first electrode by a gate dielectric OX. This structure also comprises a first electrically conductive contact region RGC1 making contact with the gate region G and a second electrically conductive contact region RGC2 making contact with the second electrode. These two contact regions are not electrically connected and thus allow corresponding potentials to be applied to the two electrodes of the capacitor and to the gate of the transistor.

Such a structure STR is particularly compact and simple to produce. This being so, its application is not limited to a memory device such as described above but such a structure may be employed in other electronic circuits such as for example elementary flip-flops, shift register master-slave elements, or filters (the capacitor C formed between the two polysilicon levels being used to set the RC time constant of the filter).

What is claimed is:

1. A memory device, comprising:
   an SRAM elementary memory cell comprising a first inverter cross-coupled with a second inverter, each of the first inverter and the second inverter comprising a first transistor, a second transistor coupled in series with the first transistor, and an integrated structure, the integrated structure comprising:
      a MOS transistor comprising a first gate dielectric and a gate region over the first gate dielectric, the MOS transistor being the second transistor of a respective one of the first inverter and the second inverter;
      a capacitor comprising a first capacitor electrode formed by the gate region of the MOS transistor, a second dielectric over the first capacitor electrode, and a second capacitor electrode over the second dielectric, wherein the second capacitor electrode is connected to a potential node;
      a first electrically conductive contact region in electrical contact with the gate region of the MOS transistor; and
      a second electrically conductive contact region in electrical contact with the second capacitor electrode, wherein the first electrically conductive contact region and the second electrically conductive contact region are not electrically connected to one another; and
   a nonvolatile elementary memory cell comprising a floating-gate transistor, the floating-gate transistor having a drain terminal coupled to an output of the first inverter and an input of the second inverter, wherein the SRAM elementary memory cell and the nonvolatile elementary memory cell together form a memory cell.

2. The device according to claim 1, wherein the first transistor of each of the first inverter and the second inverter comprises a gate region surmounted by an auxiliary region located in the same level as the second capacitor electrodes of the integrated structures and separated from the gate region by the second dielectric.

3. The device according to claim 1, wherein the MOS transistor of each of the first inverter and the second inverter comprises a pMOS transistor.

4. The device according to claim 1, wherein each second electrode is coupled to respective output of one of the two inverters.

5. The device according to claim 1, wherein each second electrode is coupled to a reference voltage node.

6. The device according to claim 1, wherein the nonvolatile elementary memory cell is coupled between a power supply terminal and the SRAM elementary memory cell, the floating-gate transistor of the nonvolatile elementary memory cell being controllable so that it is turned off during an operation for programming a datum stored in the SRAM elementary memory cell into the nonvolatile elementary memory cell.

7. The device according to claim 1, wherein the memory device comprises two groups of memory cells that each comprise a nonvolatile elementary memory cell with a floating-gate transistor;
   wherein all the floating-gate transistors having a first conduction electrode coupled to a power supply terminal and a control electrode connected to a first control line;
   wherein a second conduction electrode of each floating-gate transistor of the nonvolatile elementary memory cells of the two groups is coupled to at least outputs of two inverters, respectively, by way of a controllable interconnect stage; and
   wherein the floating-gate transistors controllable so that they are all turned off during a differential operation for programming a datum stored in the SRAM elementary memory cell into the two groups of memory cells.

8. The device according to claim 1, wherein the second dielectric comprises a silicon nitride layer sandwiched between two silicon dioxide layers.

9. The device according to claim 1, wherein the nonvolatile elementary memory cell is an EEPROM cell.

10. The device according to claim 1, wherein the device comprises a memory plane containing rows and columns of memory cells, each memory cell including an SRAM elementary memory cell and a nonvolatile elementary memory cell.

11. A memory cell comprising:
   a non-volatile memory cell;
   a first inverter comprising a first transistor and a first integrated transistor/capacitor coupled in series between a VDD node and a ground node, wherein the first integrated transistor/capacitor comprises a first MOS transistor with a gate and a capacitor that includes the gate and an electrode above the gate, the electrode being electrically coupled to a first portion of the non-volatile memory cell, the first MOS transistor being a second transistor of the first inverter;
   a second inverter comprising a second transistor and a second integrated transistor/capacitor coupled in series between the VDD node and the ground node, wherein the second integrated transistor/capacitor comprises a second MOS transistor with a gate and a capacitor that includes the gate and an electrode above the gate, the electrode being coupled to a second portion of the non-volatile memory cell, the second MOS transistor being a second transistor of the second inverter, an output of the second inverter being coupled to an input of the first inverter including the gate of the first MOS transistor, and an input of the second inverter including the gate of the second MOS transistor being coupled to an output of the first inverter.

12. The memory cell according to claim 11, wherein each integrated transistor/capacitor comprises:
   a first source/drain region;
   a second source drain region spaced from the first source/drain region by a channel region, wherein the gate overlies the channel region and the electrode is disposed above the gate;
   a first dielectric disposed between the gate and the channel region;
   a second dielectric disposed between the gate and the electrode;

a first electrically conductive contact region in electrical contact with the gate; and a second electrically conductive contact region in electrical contact with the electrode, the first and second contact regions being electrically isolated from one another.

13. The memory cell according to claim 11, wherein the electrode of the first integrated transistor/capacitor is coupled to the output of the first inverter and wherein the electrode of the second integrated transistor/capacitor is coupled to the output of the second inverter.

14. The memory cell according to claim 11, wherein the electrode of the first integrated transistor/capacitor and the electrode of the second integrated transistor/capacitor are both coupled to the VDD node.

15. The memory cell according to claim 11, wherein the electrode of the first integrated transistor/capacitor and the electrode of the second integrated transistor/capacitor are both coupled to the ground node.

16. The memory cell according to claim 11, wherein the first MOS transistor comprises a pMOS transistor and the second MOS transistor comprises a pMOS transistor.

17. The memory cell according to claim 11, wherein the memory cell comprises a single non-volatile memory cell that is coupled between the VDD node and the first inverter, the non-volatile memory cell having a floating-gate transistor that is controllable so that it is turned off during an operation for programming a datum stored by the first and second inverters into the non-volatile memory cell.

18. The memory cell according to claim 11, wherein the non-volatile memory cell comprises an EEPROM cell.

19. A memory device comprising:

an SRAM-type elementary memory cell comprising a first inverter comprising a first transistor coupled in series with a first integrated transistor/capacitor, wherein the first integrated transistor/capacitor comprises a first MOS transistor with a gate and a capacitor that includes the gate and an electrode above the gate, the SRAM-type elementary memory cell also comprising a second inverter comprising a second transistor coupled in series with a second integrated transistor/capacitor, wherein the second integrated transistor/capacitor comprises a second MOS transistor with a gate and a capacitor that includes the gate and an electrode above the gate, the first and second inverters being cross-coupled;

a first non-volatile memory unit having a first non-volatile elementary memory cell with a first floating-gate transistor, the first floating-gate transistor having a first conduction electrode coupled to a supply terminal, a control electrode coupled to a first control line, and a second conduction electrode; and a second non-volatile memory unit having a second non-volatile elementary memory cell with a second floating-gate transistor, the second floating-gate transistor having a first conduction electrode coupled to the supply terminal, a control electrode coupled to the first control line, and a second conduction electrode;

a controllable interconnection stage with a first portion coupled between the second conduction electrode of the first floating-gate transistor and an output of the first inverter and a second portion coupled between the second conduction electrode of the second floating-gate transistor and an output of the second inverter; and a control circuit configured to cause the first and second floating-gate transistors to off when a data item stored in the elementary memory cell is differentially programmed into the first and second non-volatile memory units.

\* \* \* \* \*